United States Patent [19]
Wakalopulos

[11] Patent Number: 5,909,032
[45] Date of Patent: Jun. 1, 1999

[54] APPARATUS AND METHOD FOR A MODULAR ELECTRON BEAM SYSTEM FOR THE TREATMENT OF SURFACES

[75] Inventor: George Wakalopulos, Pacific Palisades, Calif.

[73] Assignee: American International Technologies, Inc., Torrance, Calif.

[21] Appl. No.: 08/845,513

[22] Filed: Apr. 24, 1997

Related U.S. Application Data

[63] Continuation-in-part of application No. 08/369,127, Jan. 5, 1995, Pat. No. 5,612,588.

[51] Int. Cl.⁶ ..................................................... H01J 37/30
[52] U.S. Cl. ........................................ 250/492.3; 313/420
[58] Field of Search .......................... 313/420; 250/492.3, 250/492.2, 400

[56] References Cited

U.S. PATENT DOCUMENTS

| | | | |
|---|---|---|---|
| 4,661,709 | 4/1987 | Walker et al. | 250/396 R |
| 4,694,480 | 9/1987 | Skillicorn | 378/119 |
| 4,833,362 | 5/1989 | Crewe | 313/7 |
| 4,866,344 | 9/1989 | Ross et al. | 315/39.3 |
| 5,077,771 | 12/1991 | Skillicorn et al. | 378/103 |
| 5,378,898 | 1/1995 | Schonberg et al. | 250/435 |
| 5,391,958 | 2/1995 | Kelly | 313/420 |
| 5,414,267 | 5/1995 | Wakalopulos | 250/492.3 |
| 5,457,269 | 10/1995 | Schonberg | 250/492.3 |
| 5,523,577 | 6/1996 | Schonberg et al. | 250/492.3 |
| 5,604,352 | 2/1997 | Schuetz | 250/492.3 |
| 5,612,588 | 3/1997 | Wakalopulos | 313/420 |

*Primary Examiner*—Bruce Anderson
*Attorney, Agent, or Firm*—Thomas Schneck; George B. F. Yee; John P. McGuire, Jr.

[57] ABSTRACT

A modular electron beam device is disclosed, the device being housed in a modular enclosure containing a power supply subsystem coupled to provide power to an electron beam tube. The enclosure is shaped to permit stacking of plural such modular units in a way that the stripe-shaped beam emitted from each of the units completely irradiates a surface to be treated. Beams may lie on different lines but the combined beams sweep out a width on a surface which is a continuous span. In an alternate embodiment of the invention, the modular unit comprises a plurality of electron beam units, each comprising an electron tube and a filament and bias supply to power the tube. A single high voltage stack is common to the plural tube/filament/bias sub-units. A daisy-chain arrangement allows for the single high voltage stack to power all of the tube units. In yet another embodiment, the modular unit comprises a plurality of electron tubes powered by a single power supply.

20 Claims, 4 Drawing Sheets

APPARATUS AND METHOD FOR A MODULAR ELECTRON BEAM SYSTEM FOR THE TREATMENT OF SURFACES

This application is a continuation-in-part of application Ser. No. 08/369,127 filed on Jan. 5, 1995, now U.S. Pat. No. 5,612,588.

TECHNICAL FIELD OF THE INVENTION

The present invention relates to electron beam devices and in particular to electron beam devices having a modular design.

BACKGROUND OF THE INVENTION

Electron beam and ultraviolet sources are the primary options for irradiating surface layers. Existing surface curing systems, however, are fixed-size configurations and are not easily modified to accommodate different sized surfaces. Surface curing applications can involve web sizes ranging anywhere from 1 inch to 60 inches in width. However, because of the inherent non-scalability of fixed-size surface curing systems, electron beam treatment has been an impractical and therefore seldom used option.

The growth of electron beam systems has stalled due to resistance in a number of areas which challenge the advancement of the technology. First, there is the high cost of the systems resulting from the need for scalability in order to accommodate various surface dimensions. Second, is the overall size of a typical high energy electron beam system, its so-called footprint, which typically includes a vacuum sub-system, the power supply and transformers. A related concern is the need for protective X-ray shielding in high energy electron beam systems. This results in added material and physical complexity of the system.

Operationally, there is concern over the issue of surface reaction rate of the curable material with atmospheric oxygen. This undesirable interaction of the chemistry with oxygen affects the chain reaction of the surface, resulting in improperly treated surfaces. System up-time is another consideration worth noting. With single-unit electron beam devices, failure of any part of the device makes the entire system inoperable.

Manufacture of single-unit systems tends to drive up the cost of these systems. Precise alignment of the individual components comprising such systems is required and testing of large systems is a time consuming effort, adding significantly to the cost of manufacture.

What is needed is an electron beam system suitable for surface curing applications, which can economically be scaled up to accommodate high-speed, wide-web curing operations. At the same time, such a system should have a low specific cost and is compact to accommodate a wide variety of electron beam applications.

SUMMARY OF THE INVENTION

In accordance with the present invention, a modular electron beam device includes a modular enclosure housing an electron beam tube for producing stripe-shaped electron beams which are emitted through an opening in the enclosure. The enclosure also houses a power supply for powering the electron beam tube. The modular enclosure has a shape which can receive another such enclosure in a manner such that the two electron beams together sweep over a region that has a width substantially the sum of the widths of such beams.

In an alternate embodiment, an electron beam device is comprised of a plurality of electron beam units. Each unit comprises a vacuum tube element for producing an electron beam with its own filament and bias supply to provide power to the vacuum tube. In addition, each electron beam unit includes a pair of high voltage terminals, allowing the units to be connected in daisy-chain fashion. This configuration allows for a single high voltage stack to be used to power the daisy-chained units. A feedback circuit is provided to monitor each of the beams and to adjust the output of each unit so that the beams have the same energy level.

The electron beam tubes used in the above embodiments comprise a vacuum sealed chamber having at one end a filament for producing electrons and a cathode plate proximate the filament. At a distal end of the chamber, a slot-shaped aperture permits emission of electrons from the tube. An electron permeable window provides an airtight seal over the aperture. The window is coupled to provide an anodic connection, typically ground potential. In one variation of the invention, the electron beam tube generates stripe-shaped beams by electrostatic or magnetic means, such as a magnetic yoke mounted around the tube operated to cause a beam of electrons to scan in reciprocating fashion. Alternatively, the filament element may be an elongate element producing a band of electrons which are deflected by a similarly elongate parabolic cathode. The resulting stream of electrons emitted from the tube has a stripe shape to it.

In yet another embodiment of the present invention, an electron beam device comprises a plurality of electron beam tubes, each capable of forming a stripe-shaped beam of electrons. In this embodiment, a single power supply is used to power each of the tubes. The tubes are arranged in a staggered format in such a way that the stripe-shaped beams each is parallel to a given axis, and pairs of adjacent beams lie along a common axis. The resulting zone of irradiation swept by the beams is equal to the sum of the width of each of the beams. Each of the electron beam tubes in this embodiment additionally includes a pair of tuning grids used to steer the electron beam and to adjust its intensity.

The modular approach of the present invention provides an easy and inexpensive upgrade path for scaling up to large surface treatment applications, simply by combining additional units as needed. In addition, added flexibility is achieved because the system can be scaled down when needed, simply by removing unneeded electron beam modules. System reliability is increased since a failure of one or more modules can be quickly and inexpensively corrected by replacing the failed units, allowing the operation to continue while the failed units are repaired offline.

BEST MODE OF CARRYING OUT THE INVENTION

Figure 1:
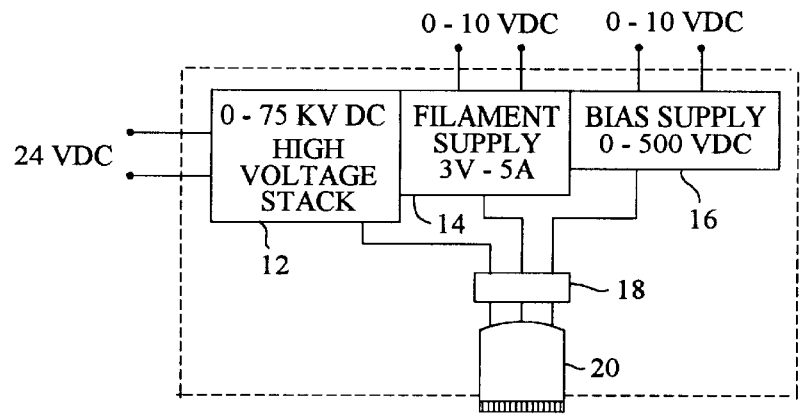
FIG. 1 is a block diagram of the present invention.

As shown in the schematic of FIG. 1, the modular electron beam device of the present invention includes a modular enclosure 10 housing an electron beam tube 20 and a power supply subsystem comprising a high voltage stack 12, a filament supply 14, and a bias supply 16. These components are readily available and do not involve any talent beyond a level of ordinary skill to acquire and assemble. The components of the power supply subsystem are coupled to the electron beam tube 20 through a socket 18. The electron beam tube 20 is configured to emit a stripe-shaped electron beam through an electron emitting end 21.

Figure 2A:
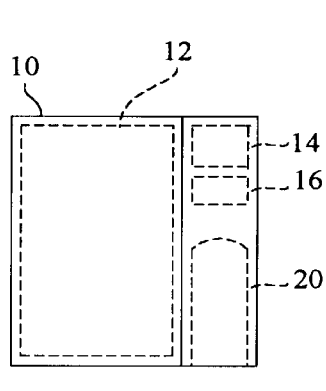
FIGS. 2A and 2B show the packaging of an electron beam module.
Figure 2B:
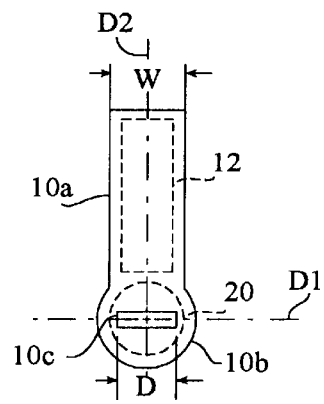

In the preferred embodiment of the invention shown in FIGS. 2A and 2B, the modular enclosure 10 consists of a rectangular portion 10a and a cylindrical portion 10b coupled to a side of the rectangular portion. The high voltage stack 12 is a high voltage step-up transformer and so typically will occupy a large portion of the interior volume of the enclosure. Therefore, it is shown disposed in the rectangular portion 10a of the enclosure. The filament and bias supplies 14, 16, being lower voltage and thus smaller devices, are collocated with the electron beam tube 20 in the cylindrical portion 10b.

The bottom view of FIG. 2B shows that an opening 10c is formed through the enclosure, thus exposing the electron emitting end 21 of the electron beam tube 20. The opening 10c is slot-shaped to coincide with the stripe-shaped beams emitted by the electron beam tube. As shown in the figure, the long dimension D1 of the slotted opening 10c is oriented perpendicular relative to the long dimension D2 of the enclosure 10. The bottom view of FIG. 2B further shows that the diameter D of the cylindrical portion 10b is slightly wider than the width W of the rectangular portion 10a. As will be explained below with reference to FIG. 3, such an enclosure facilitates stacking together multiple modules.

Figure 3:
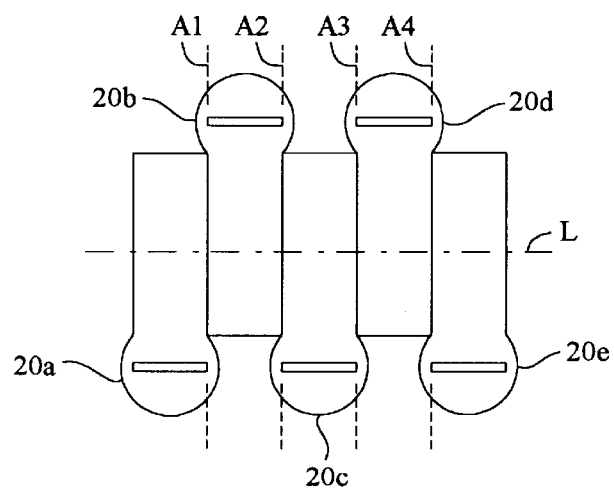
FIG. 3 shows the stacking made possible by the modular design shown in FIGS. 2A and 2B.

Turning then to the bottom view of FIG. 3, an arrangement of five modules 20a–20e is shown in which the modules are stacked together in accordance with the invention. Each module is stacked adjacent its neighbor in such a way that the cylindrical portions of adjacent modules (e.g. 20a and 20b) are distally positioned relative to each other. The resulting stack of modules resembles two sets of interlocked fingers when viewed from the top, or the bottom as in FIG. 3. It can be appreciated from FIG. 3 that the shape and dimensions of the enclosures 18 result in a desired alignment of the stripe-shaped electron beams.

Figure 4:
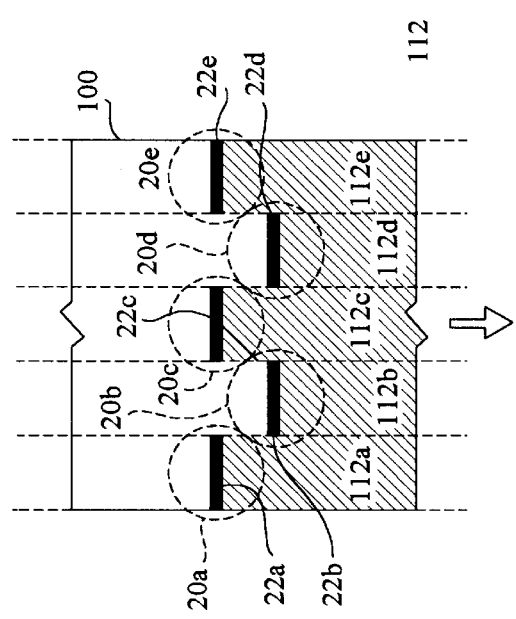
FIG. 4 illustrates zone of irradiation swept out by the arrangement of the electron beams modules of the present invention.

FIGS. 3 and 4 show that the stripe-shaped electron beams are aligned to sweep out a continuous zone of irradiation upon a surface to be treated. In FIG. 3, the modules are stacked so that adjacent pairs of such modules share a common axis; e.g. modules 20a and 20b share axis A1, modules 20b and 20c share axis A2, and so forth. In addition, the cylindrical portions of the modules are arranged in staggered fashion so that the slotted openings 10c of adjacent pairs of modules lie along their respective common axes, more clearly exemplified in FIG. 4.

FIG. 4 shows a surface 100 which is carried beneath a set of electron beam tubes 20a–20e, shown in phantom, in the direction indicated. As noted above, the electron tubes emit stripe-shaped beams 22a–22e which strike the surface being treated 100. As shown in the figure, each beam irradiates a portion of the surface, forming strips of irradiation regions 112a–112e on the surface. As a result of the above-described alignment of the tubes, the irradiated strips 112a–112e form a continuous swath spanning the width of the surface 100 being treated. Thus, surfaces of any width are easily and quickly accommodated simply by adding (or removing) modules as needed. In practice, some overlap of adjacent irradiation regions is desired in order to deliver a sufficiently uniform dose to the surface 100. Preferably, the amount of overlap will ensure a dose-delivered variance in the range of ±5%.

Figure 5A:
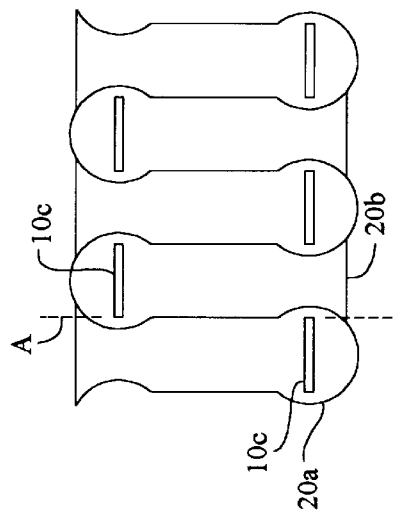
FIGS. 5A–5C show alternate shapes for the enclosure shown in FIGS. 2A, 2B, and 3.
Figure 5C:
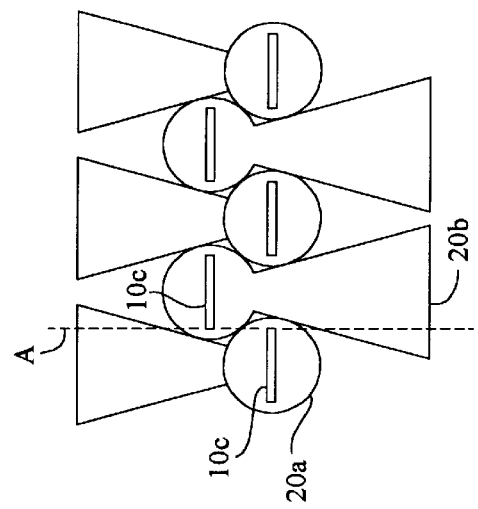
Figure 5B:
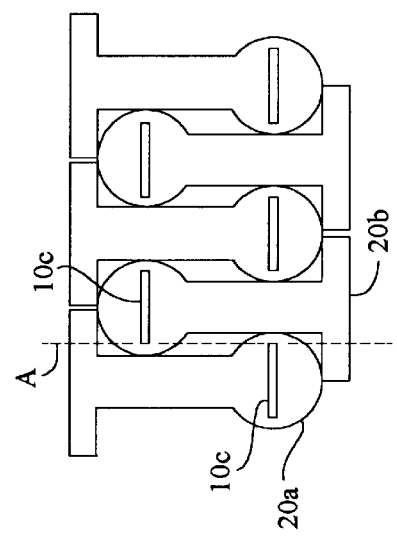

Returning to FIGS. 2 and 3, it is now clear that the specific shape of the enclosure 10 is not critical. It is necessary that the enclosure be capable of containing the power subsystem and the electron beam tube, and that the enclosure have a shape which permits stacking of plural modules in the manner described above and shown in FIGS. 3 and 4, namely that the individual stripe-shaped electron beams sweep out a region of irradiation on the surface being treated that is as wide as the sum of the width of the beams. FIGS. 5A–5C show alternative shapes for the enclosure 10. Observe that in each case, the shape of the enclosure permits the slotted apertures 10c of adjacent modules 20a, 20b to lie along a common axis A.

Turn now to FIGS. 6A–7B for a discussion of the electron beam tubes used in the present invention. As illustrated schematically in FIGS. 6A and 6B, an electron tube 20 comprises a vacuum tube envelope 50 containing at one end thereof a thermionic filament member 54 and a cathode plate 56. The power subsystems 12–16 (FIG. 1) are electrically coupled to the filament 54 and the cathode 56 via electrodes 62. At an end of the tube envelope 50 distal to the cathode/filament pair is a slotted aperture 52. The aperture is sealed by a window 58 which has an anodic connection, typically to ground. A desired property of the window 58 is that it is capable of maintaining a gas-tight seal, yet is permeable to electrons. Preferably, the window is a thin layer of low-Z material (i.e. low atomic number material). A more detailed discussion is provided in U.S. Pat. No. 5,414,267 and U.S. Pat. No. 5,612,588, both assigned to the assignee of the present invention and incorporated herein by reference.

Figure 6A:
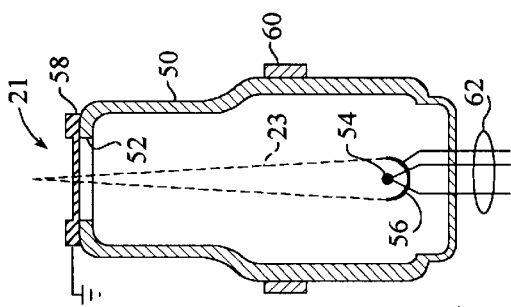
FIGS. 6A–8B schematically illustrate variations of the electron beam tube used in the present invention.

In the variation of the electron tube shown in FIG. 6A, a point-source beam of electrons 23 is produced which must be scanned to produce the desired stripe-shaped electron beam. This is accomplished by having a magnetic yoke 60 which deflects the beam in reciprocating fashion thus producing a stripe-shaped beam. Alternatively, beam deflection can be achieved through the use of electrostatic plates, such as the plates 61 shown in FIG. 6B. The underlying principles of magnetic and electrostatic deflection techniques and methods are known and well understood, so further discussion in this area is not necessary.

Figure 7A:
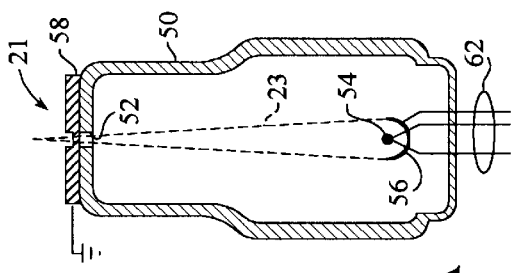
Figure 7B:
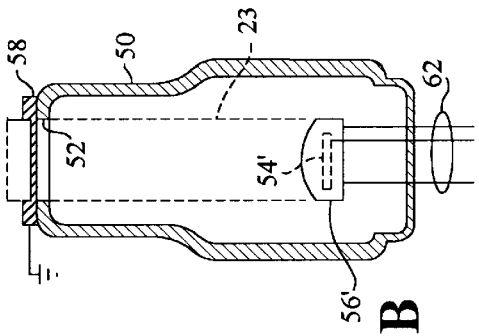

FIGS. 7A and 7B show an electron tube capable of producing a stripe-shaped beam without the aid of a deflection element. Such a tube is more fully described in above-identified U.S. Pat. Nos. 5,414,267 and 5,612,588. Briefly, the tube comprises an elongate linear filament 54' for producing electrons and a similarly elongate parabolic-shaped cathode plate 56'. The elongate filament produces a cloud of electrons which extends the length of the filament. The electrons are then accelerated by the cathode toward the anode-connected window 58, thus creating a beam of electrons having the shape of a stripe. Although the figures show the use of a thermionic filament 54, 54', an indirectly heated cathode tube could be substituted for producing electrons.

Figure 9:
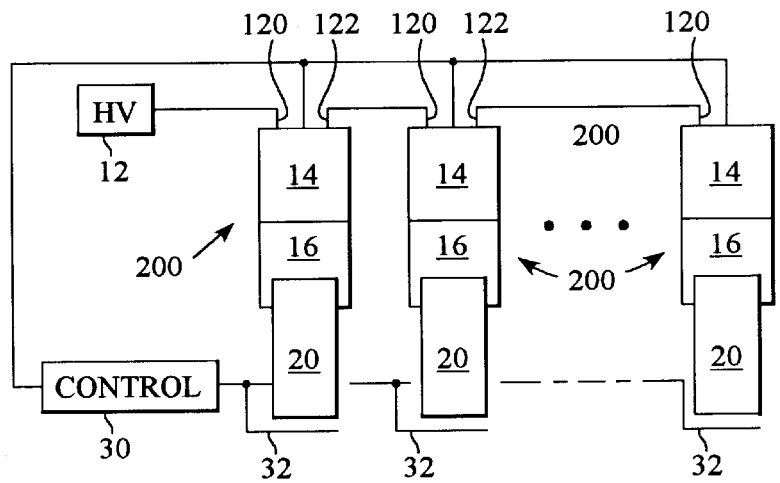
FIGS. 9 and 10 show alternate embodiments of the present invention.

Refer now to FIG. 9 for a discussion of an alternate embodiment of the invention. Illustrated is a modular configuration where each electron beam module 200 comprises an electron beam tube 20 powered by its own filament supply and bias supply 14, 16. In addition, each module 200 includes a first and a second high voltage terminal 120, 122, one terminal for connection to a high voltage source and the other terminal for passing on the high voltage source to another module. This permits the modules 200 to be coupled in daisy-chain fashion and powered by a single high voltage source, as shown in FIG. 9. The modules are stacked in staggered fashion much like the modules shown in FIG. 3 to provide a continuous band of radiation across the width of a surface being treated. Additional modules 200 can be added to the chain to provide wider radiation coverage of the surface being treated.

The output of each module 200 is monitored by a monitoring means 32, such as an ammeter. This information is fed to controller 30, which compares the outputs of all the modules 200. The controller 30, typically a computer-based device, then adjusts certain ones of the modules to vary their output. This feedback mechanism can be used to equalize the outputs of the modules, providing a uniform radiation of the surface being treated. Alternatively, the controller 30 can be programmed to provide a non-uniform arrangement of beam outputs from the modules for applications which require such treatment.

Figure 10:
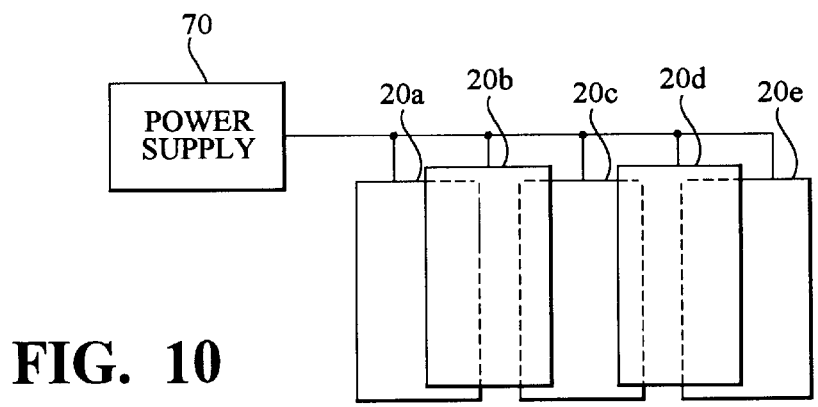

FIG. 10 shows yet another embodiment of the invention, illustrating a modular electron beam device comprising a single power supply 70 coupled to plural electron beam tubes 20a–20e. The supply 70 in this embodiment includes the high voltage stack, the filament source and the bias source. Note the staggered stacking arrangement of the tubes which is shown more clearly in FIG. 4. Additional tubes can be added to the stack as needed to provide a wider swath of irradiation on the surface being treated.

Figure 8A:
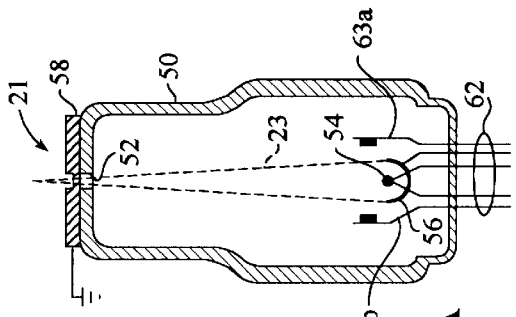
Figure 6B:
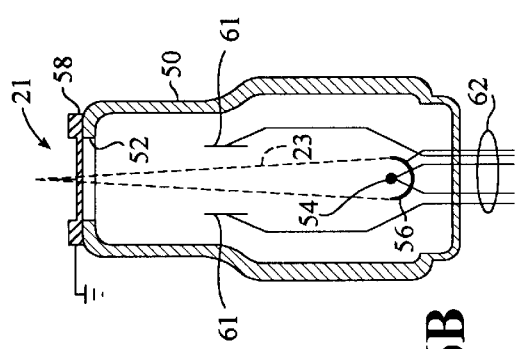
Figure 8B:
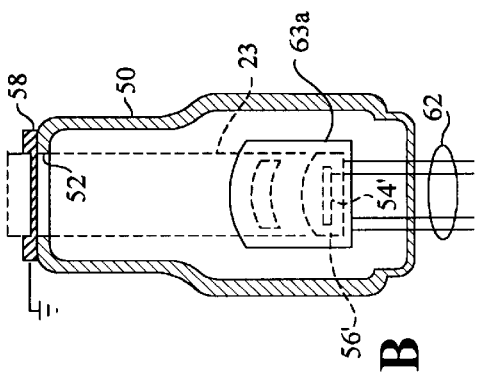
Figure 11:
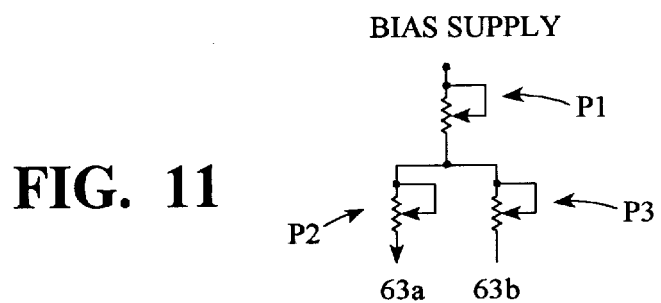
FIG. 11 is a circuit for adjusting the tuning grid illustrated in FIGS. 6C and 6D.

Since the electron beam tubes 20a–20e are powered by a common source 70, each tube must be pre-balanced to produce uniform output among all of the tubes. There are two aspects of the beam that must be adjusted to achieve a uniform output: beam intensity and beam position. FIGS. 8A and 8B show a variation of the electron tube shown in FIGS. 6A–7B which permits such adjustments. As shown in FIG. 8A, a split-grid pair 63a, 63b is included in the electron tube. By applying appropriate potentials at each grid the beam can be positioned by steering the beam as shown. Similarly, the beam intensity can controlled by varying the amount of bias applied to the grid pair. FIG. 11 shows a resistor circuit which permits both adjustments to be made. The bias supply is coupled through potentiometer P1 to potentiometers P2 and P3, which in turn are coupled to grids 63a and 63b respectively. Adjusting potentiometer P1 varies the amount of voltage bias, thus controlling the intensity of the beam. Adjusting P2 and P3 separately creates different voltages on the respective grids 63a, 63b, so that the electric potential between the grid pair can be varies to the steer the beam as needed. In the preferred embodiment, the tuning resistors can be permanently built into the tube socket 18 (FIG. 1) of each tube.

I claim:

1. A modular electron beam apparatus comprising:
   a modular housing;
   an electron beam tube contained in the housing, the electron beam tube having an electron emitting end exposed through an opening in the housing, the electron beam tube further having means for producing a stripe-shaped beam having a width substantially equal to a dimension of the housing, and;
   a power supply means contained in the housing, coupled to provide power to the electron beam tube;
   the modular housing having a shape to fit together closely in an interlocking manner with an adjacent second modular apparatus in a manner such that the stripe-shaped electron beams emitted from both modular apparatuses together sweep over a region having a continuous width that is greater than the width of either beam alone but less than the sum of widths of the two electron beams.

2. The modular apparatus of claim 1 wherein the modular housing includes means for coupling to a second modular apparatus, the modular housing being dimensioned so that a region swept by the stripe-shaped electron beam is substantially adjacent a region swept by the stripe-shaped electron beam of the second modular apparatus.

3. The modular apparatus of claim 1 wherein the modular housing includes a rectangular member and a cylindrical member attached and vertically aligned along a first side of the rectangular member, the electron beam tube being disposed within the cylindrical member.

4. The modular apparatus of claim 3 wherein the cylindrical member includes a slotted opening oriented perpendicular to a long axis of the rectangular member.

5. The modular apparatus of claim 3 wherein the cylindrical member has a diameter greater than the width of the rectangular member, whereby a first modular apparatus can be stacked upon a second modular apparatus such that a stripe-shaped electron beam emitted from the first modular apparatus sweeps out a zone of irradiation that is substantially adjacent to a zone of irradiation swept out by a stripe-shaped electron beam emitted from the second modular apparatus.

6. The modular apparatus of claim 1 wherein the electron beam tube comprises a vacuum tube envelope having an aperture at a first end of the vacuum tube envelope, a base at a second end of the vacuum tube envelope, and an electron permeable, gas impermeable, low-Z window covering the aperture through which a beam of electrons is emitted; the filament includes first electrode ends passing through the base for electrical connection to the power supply means; the means for accelerating includes a cathode plate disposed proximate the filament and further including an anode coupling to the window, the cathode having second electrode ends passing through the base for electrical connection to the power supply means.

7. A modular electron beam device comprising:
   an enclosure for housing a plurality of electron beam units, the enclosure having a shape to fit together closely in an interlocking manner with an adjacent enclosure of a second electron beam device
   each electron beam unit having:
   a vacuum tube containing therein a filament and a cathode, the vacuum tube including a slot-shaped aperture at one end thereof for emitting the electron beam and further including a window to provide an airtight seal over the aperture;
   a first high voltage terminal coupled to provide a high voltage source to the electron beam tube;
   a second high voltage terminal coupled to the first high voltage terminal;
   a filament power supply electrically coupled to the filament; and
   a bias power supply electrically coupled to the cathode;
   the electron beam units being coupled in daisy-chain fashion, wherein the first high voltage terminal of an electron beam unit is coupled to the second high voltage terminal of another electron beam unit.

8. The modular device of claim 7 wherein each of the electron beam units emits a stripe-shaped beam and the electron beam units are aligned such that the stripe-shaped beams sweep out a width on a target surface which is a continuous span.

9. The modular device of claim 8 wherein each of the electron beam units further includes means for deflecting the electron beam thereby producing the stripe-shaped beam.

10. The modular device of claim 9 wherein the means for deflecting is a magnetic yoke externally disposed about the electron beam unit.

11. The modular device of claim 8 wherein for each of the electron beam units the filament is an elongated linear filament and the cathode has a elongated shape, thereby producing the stripe-shaped beam.

12. The modular device of claim 7 further including a high voltage power supply coupled to the first high voltage terminal of a first one of the electron beam units.

13. The modular device of claim 7 wherein the window of each electron beam unit is a low-Z crystalline membrane which is permeable to electrons and impermeable to gases.

14. The modular device of claim 7 wherein the enclosure further houses a feedback circuit for sensing electron beams emitted from the electron beam units and adjusting the operation of the electron beam units so that the energies of the emitted electron beams are substantially equal to each other.

15. An electron beam device comprising:
an enclosure containing therein a plurality of electron beam tubes adjacent one another and a power supply coupled to provide power to the electron beam tubes, the enclosure being of a shape to fit together closely in an interlocking manner with an adjacent enclosure of a second electron beam device;

each of the electron beam tubes comprising a sealed chamber defined by a first end and a second end and having a thermionic filament disposed in the chamber and a cathode disposed proximate the thermionic filament, the first end of the sealed chamber having a slot-shaped aperture therethrough and sealed by an electron permeable member, the thermionic filament and cathode each having electrodes passing through the second end for electrical coupling to the power supply;

the electron beam tubes being oriented so that the slot-shaped apertures are parallel to a longitudinal axis;

the electron beam tubes being staggered so that the slot-shaped apertures of adjacent pairs of electron beam tubes lie along a common axis.

16. The electron beam device of claim 15 wherein for each of the electron beam tubes the electron permeable member is a low-Z crystalline material.

17. The electron beam device of claim 16 wherein the electron permeable member includes an anodic connection to provide a potential gradient between the cathode and the electron permeable member.

18. The electron beam device of claim 15 wherein each of the electron beam tubes includes a deflection means for reciprocating a beam of electrons to produce a stripe-shape beam of electrons.

19. The electron beam device of claim 15 wherein for each of the electron beam tubes the filament has an elongate linear shape and the cathode has an elongate shape, thereby producing a stripe-shaped beam of electrons.

20. The electron beam device of claim 15 wherein each of the electron beam tubes includes a pair of tuning grids disposed within the sealed chamber downstream of the thermionic filament, the tuning grids further disposed in opposed relation to each other so that an electron beam can pass therebetween, the tuning grids having an adjustment means coupled to the power supply for creating a voltage potential therebetween, thereby steering a passing electron beam; whereby the electron beam of each of the electron beam tubes can be individually adjusted.

* * * * *

UNITED STATES PATENT AND TRADEMARK OFFICE
CERTIFICATE OF CORRECTION

PATENT NO : 5,909,032
DATED : June 1, 1999
INVENTOR(S) : George Wakalopulos

It is certified that error appears in the above-identified patent and that said Letters Patent is hereby corrected as shown below:

```
        On the title page, after [22] Filed:  Apr. 24,
1997", delete:
        "Related U.S. Application Data

[63] Continuation-in-part of application No. 08/369,127,
Jan. 5, 1995, Pat. No. 5,612,588."

Col. 1, lines 5-7, delete "This application is
a continuation-in-part of application Ser. No. 08/369,127
filed on Jan. 5, 1995, now U.S. Pat. No. 5,612,588.".
```

Signed and Sealed this

Twenty-third Day of May, 2000

Attest:

Q. TODD DICKINSON

*Attesting Officer*  *Director of Patents and Trademarks*